United States Patent

Haruna

[11] Patent Number: 5,254,165
[45] Date of Patent: Oct. 19, 1993

[54] IMAGE FORMING APPARATUS
[75] Inventor: Akira Haruna, Nara, Japan
[73] Assignee: Sharp Kabushiki Kaisha, Osaka, Japan
[21] Appl. No.: 978,045
[22] Filed: Nov. 18, 1992

Related U.S. Application Data

[63] Continuation of Ser. No. 629,669, Dec. 19, 1990, abandoned.

[30] Foreign Application Priority Data

Dec. 19, 1989 [JP] Japan ............... 1-330063

[51] Int. Cl.$^5$ .................................. B05C 11/00
[52] U.S. Cl. ............................ 118/60; 355/27
[58] Field of Search ............. 355/27, 295; 354/301; 118/60

[56] References Cited

U.S. PATENT DOCUMENTS

| | | | |
|---|---|---|---|
| 4,408,559 | 10/1983 | Sugiura | 118/60 |
| 4,426,653 | 1/1984 | Komada | 346/153.1 |
| 4,745,435 | 5/1988 | Sakata et al. | 355/14 |
| 4,761,670 | 8/1988 | Tanaka et al. | |
| 4,962,314 | 10/1990 | Hirota et al. | 355/100 |
| 4,978,560 | 12/1990 | Stone | 118/60 |

FOREIGN PATENT DOCUMENTS 0320973 6/1989 European Pat. Off.
0333481 9/1989 European Pat. Off.

*Primary Examiner*—W. Gary Jones
*Assistant Examiner*—Dean Tan Nguyen
*Attorney, Agent, or Firm*—David G. Conlin; Robert F. O'Connell

[57] ABSTRACT

An image forming apparatus including an image receiving sheet transport system in which a photosensitive sheet and an image receiving sheet are pressed together to form an image on the image receiving sheet which is then transported to a glosser unit at a slower speed than the transporting speed of the image receiving sheet by a pressure developing device and the glosser unit, the image receiving sheet being temporarily buckled between the pressure developing device and the transport device, and then being taken up by the glosser unit. The image receiving sheet is smoothly pulled by a one-way clutch in the direction in which it is stretched.

5 Claims, 2 Drawing Sheets

IMAGE FORMING APPARATUS

This is a continuation of copending application(s) Ser. No. 07/629,669 filed on Dec. 19, 1990, now abandoned.

BACKGROUND OF THE INVENTION

1. Field of the Invention

The present invention relates generally to an image forming apparatus, and more particularly to an image receiving sheet transport system used for an image forming apparatus which forms an image by superimposing and pressing a photosensitive sheet coated with light and pressure sensitive microcapsules containing photosetting materials and coloring dyes onto an image receiving sheet coated with developer which reacts with the coloring dyes to develop colors. The image receiving sheet transport system transports an image receiving sheet after the image receiving sheet has been pressed together with a photosensitive sheet superimposed thereon.

2. Description of the Prior Art

When a photosensitive sheet coated with light and pressure sensitive microcapsules containing photosetting materials and coloring dyes is exposed to image forming light such as light reflected from a document, the microcapsules struck by the light harden to form a latent image. On the thus formed latent image, an image receiving sheet coated with developer which reacts with the coloring dyes contained in the microcapsules to develop colors is superimposed and pressed together, which causes unhardened microcapsules to rupture and the coloring dyes contained therein to flow out onto the image receiving sheet, thus developing the latent image.

The image receiving sheet and the photosensitive sheet superimposed thereon are pressed together using a pressure developing device. The pressure developing device is so constructed as to apply and release pressure, the pressure being applied only during the pressure developing process in which the image receiving sheet with the photosensitive sheet superimposed thereon is passed therethrough. That is, when the leading edge of the latent image formed on the photosensitive sheet and the leading edge of the image receiving sheet reach the pressure developing device, the pressure developing device theretofore in a pressure release condition works to apply pressure onto the leading edges, and when the trailing edges of the image receiving sheet and the latent image on the photosensitive sheet reach the pressure position in the pressure developing device, the pressure is released.

The image receiving sheet passed through the pressure developing device is transported on to a gloss imparting unit, hereinafter referred to as "glosser unit", where it is treated with heat and pressure. Application of heat and pressure accelerates the coloring reaction of the coloring dyes, while causing thermoplastic resin, with which the image receiving sheet is pre-coated, to soften and melt to cover the surface of the image receiving sheet, thereby giving a glossy finish to the image.

When the pressure is released with the trailing edge of the image receiving sheet reaching the pressure position in the pressure developing device, the pressure developing device stops transporting the image receiving sheet, but the glosser unit continues to run. As a result, though for a moment, the trailing edge of the image receiving sheet remains pressed by the pressure developing device while it is not being transported, and the leading edge of the image receiving sheet, which has already reached the glosser unit, is kept from further transportation because of the pulling force applied from the trailing edge thereof. As a result, the leading edge of the image receiving sheet is subjected to excess heat by the glosser unit, thereby giving rise to the possibility of offset in which the developer on the image receiving sheet adheres to the glosser unit.

SUMMARY OF THE INVENTION

The image receiving sheet transport system for the image forming apparatus of this invention, which overcomes the above-discussed and numerous other disadvantages and deficiencies of the prior art, comprises a pressure developing device for transporting a photosensitive sheet coated with light and pressure sensitive microcapsules containing photosetting materials and coloring dyes and an image receiving sheet coated with developer which reacts with the coloring dyes to develop colors, the two sheets being superimposed one on top of the other for transportation, during which the two sheets are pressed together to form an image on the image receiving sheet, pressure being applied when the leading edge of the image receiving sheet arrives and being released when the trailing edge thereof passes; a glosser unit for heating and pressing the image receiving sheet passed through the pressure developing device, to give a glossy finish to the image formed on the image receiving sheet; and a transport device provided between the pressure developing device and the glosser unit, for transporting the image receiving sheet passed through the pressure developing device on to the glosser unit, wherein power is transmitted to the transport device via a one-way clutch which transmits torque only in the transporting direction of the image receiving sheet, the transporting speed of the image receiving sheet by the transport device is slower than the transporting speed of the image receiving sheet by the pressure developing device and the glosser unit.

In a preferred embodiment, the transporting speed of the image receiving sheet by the pressure developing device is equal to the transporting speed of the image receiving sheet by the glosser unit.

In a preferred embodiment, the transport device has a pair of transport belts.

In a preferred embodiment, each of the transport belts is applied on a pair of driving and idle rollers.

In a preferred embodiment, power is transmitted to the driving roller via a one-way clutch.

According to the present invention, when the leading edge of the image receiving sheet has reached the transport device after passing through the pressure developing device, the image receiving sheet is caused to buckle between the pressure developing device and the transport device since the transporting speed of the image receiving sheet by the transport device is slower than the transporting speed of the image receiving sheet by the pressure developing device. With the image receiving sheet in the thus buckled state, the leading edge of the image receiving sheet is fed into the glosser unit, the developing process by the pressure developing device and the glossing process by the glosser unit being performed at the same time.

Thereafter, when the trailing edge of the image receiving sheet is pressed by the pressure developing device, the transportation of the image receiving sheet by the pressure developing device stops. At this time, the glosser unit and the transport device still keep running to transport the image receiving sheet, thus feeding the buckled portion of the image receiving sheet between the transport device and the pressure developing device into the glosser unit. When the buckled portion of the image receiving sheet has been fed into the glosser unit, since the transporting speed of the image receiving sheet by the glosser unit is faster than the transporting speed of the image receiving sheet by the transport device, the image receiving sheet is pulled by the glosser unit. At this time, since power is transmitted to the transport device via a one-way clutch that transmits torque only in the transporting direction of the image receiving sheet, the transport device smoothly transports the image receiving sheet in the transporting direction thereof even if force is applied in that direction. After the pressure developing device has released its pressure, the image receiving sheet is transported by the transport device and the glosser unit.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 2:
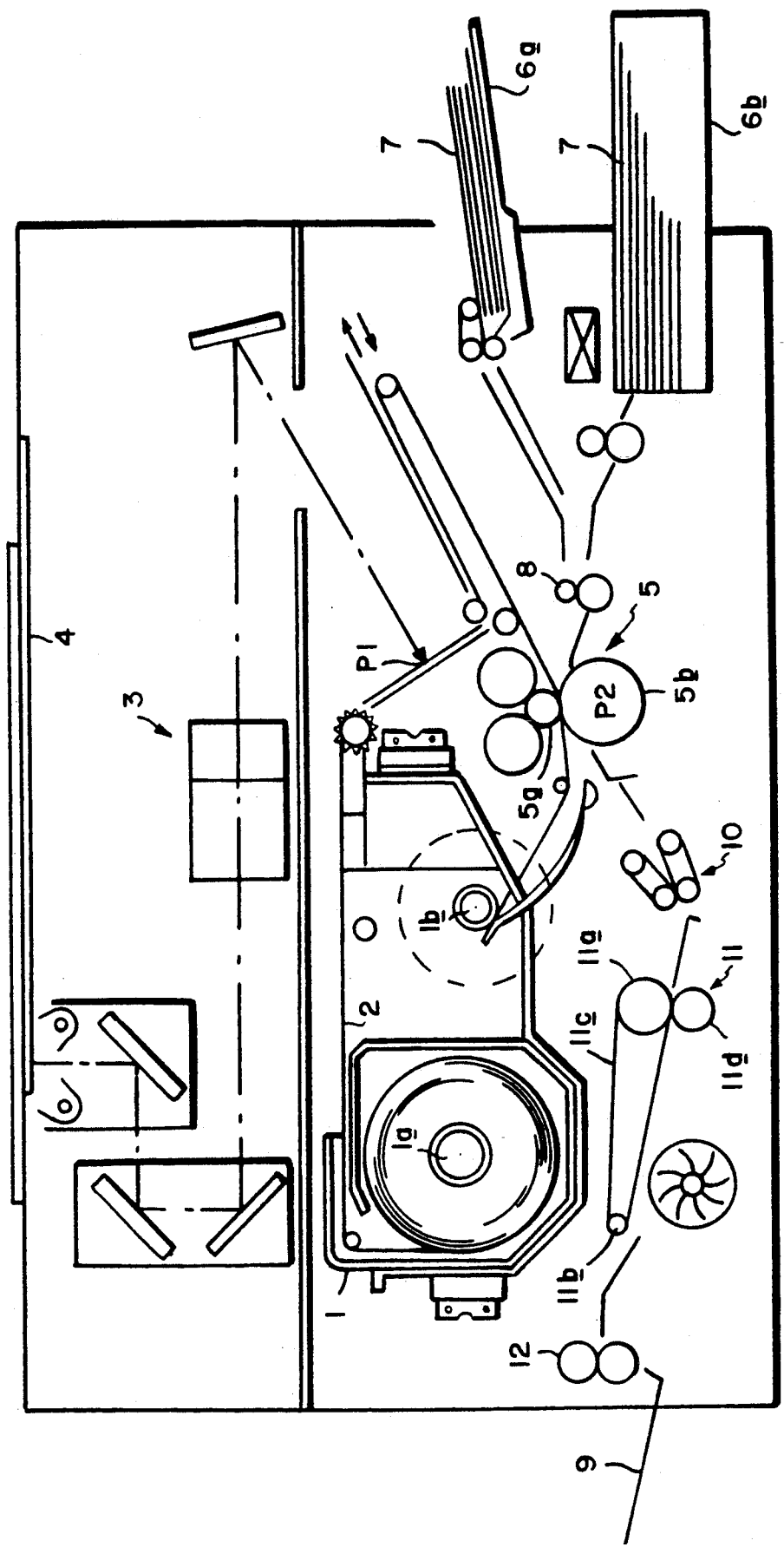
FIG. 2 is a schematic front view showing an image forming apparatus equipped with the image receiving sheet transport mechanism.

FIG. 2 is a schematic front view showing a copying machine which forms an image using a photosensitive sheet and an image receiving sheet.

A photosensitive sheet cartridge 1 is detachably mounted in one side within the copying machine. The photosensitive sheet cartridge 1 is provided with a supply shaft 1a and a takeup shaft 1b, and a fresh photosensitive sheet 2 is rolled on the supply shaft 1a. The photosensitive sheet 2 housed in the photosensitive sheet cartridge 1 mounted in the copying machine is delivered from the supply shaft 1a toward the center portion of the copying machine.

In the upper part of the copying machine, there is disposed an optical system 3. The optical system scans a document placed on a document table 4 for exposure and directs the reflected light therefrom to an exposure section P1 disposed adjacent to the center portion of the copying machine. The photosensitive sheet 2 drawn out of the photosensitive sheet cartridge 1 is passed through the exposure section P1 and then through a pressure developing section P2 in a pressure developing device 5 before being taken up onto the takeup shaft 1b of the photosensitive sheet cartridge 1. When it is passing through the exposure section P1, the photosensitive sheet 2 is exposed to the light reflected from the document on the document table 4 by means of the optical system 3 disposed in the upper part of the copying machine, thereby forming a latent image on the photosensitive sheet 2.

The pressure developing device 5 has a pair of upper and lower pressure developing rollers 5a and 5b. The upper pressure developing roller 5a is movable vertically by means of a pressure mechanism, not shown, having an eccentric cam and a spring. The upper pressure developing roller 5a is moved downward and pressed against the lower pressure developing roller 5b, the pair of rollers thus being pressed against each other. The pressure developing section P2 is the point where the pair of pressure developing rollers 5a and 5b contact under pressure. When the upper pressure developing roller 5a is moved upward, the pressure is released on the lower pressure developing roller 5b. A pair of backup rollers 5c and 5d are provided to apply uniform pressure to the upper pressure developing roller 5a along the axial direction thereof. Power from a main motor 14 is transmitted to the lower pressure developing roller 5b with its speed reduced by a suitable speed reducing mechanism 20 (see FIG. 1).

On the opposite side of the copying machine from where the photosensitive sheet cartridge 1 is mounted, there are mounted paper cassettes 6a and 6b which respectively hold image receiving sheets 7. In forming a copy image, an image receiving sheet 7 is fed into the copying machine from either one of the paper cassettes 6a or 6b, and the thus fed image receiving sheet 7 is temporarily stopped by a resist roller 8 before it is further transported to the pressure developing device 5 at a prescribed timing.

The image receiving sheet 7 is transported to the pressure developing device 5 synchronized with the timing of transportation of the photosensitive sheet 2 in such a way that the image receiving sheet 7 is superimposed on the latent image area on the photosensitive sheet 2 exposed to the image light. The photosensitive sheet 2 and the image receiving sheet 7, superimposed one on top the other, are passed through the pressure developing section P2 between the pair of pressure developing rollers 5a and 5b of the pressure developing device 5 which are pressed against each other. As this is happening, unhardened microcapsules on the photosensitive sheet 2 are caused to rupture, causing the coloring dyes contained therein to flow out. The coloring dyes thus caused to flow out react with the developer on the image receiving sheet 7 to develop thereon the latent image formed by the unhardened microcapsules on the photosensitive sheet 2.

The image receiving sheet 7 on which the image has been formed is transported on to a glosser unit 11 through a paper transport device 10 disposed to one side of the pressure developing device 5.

Figure 1:
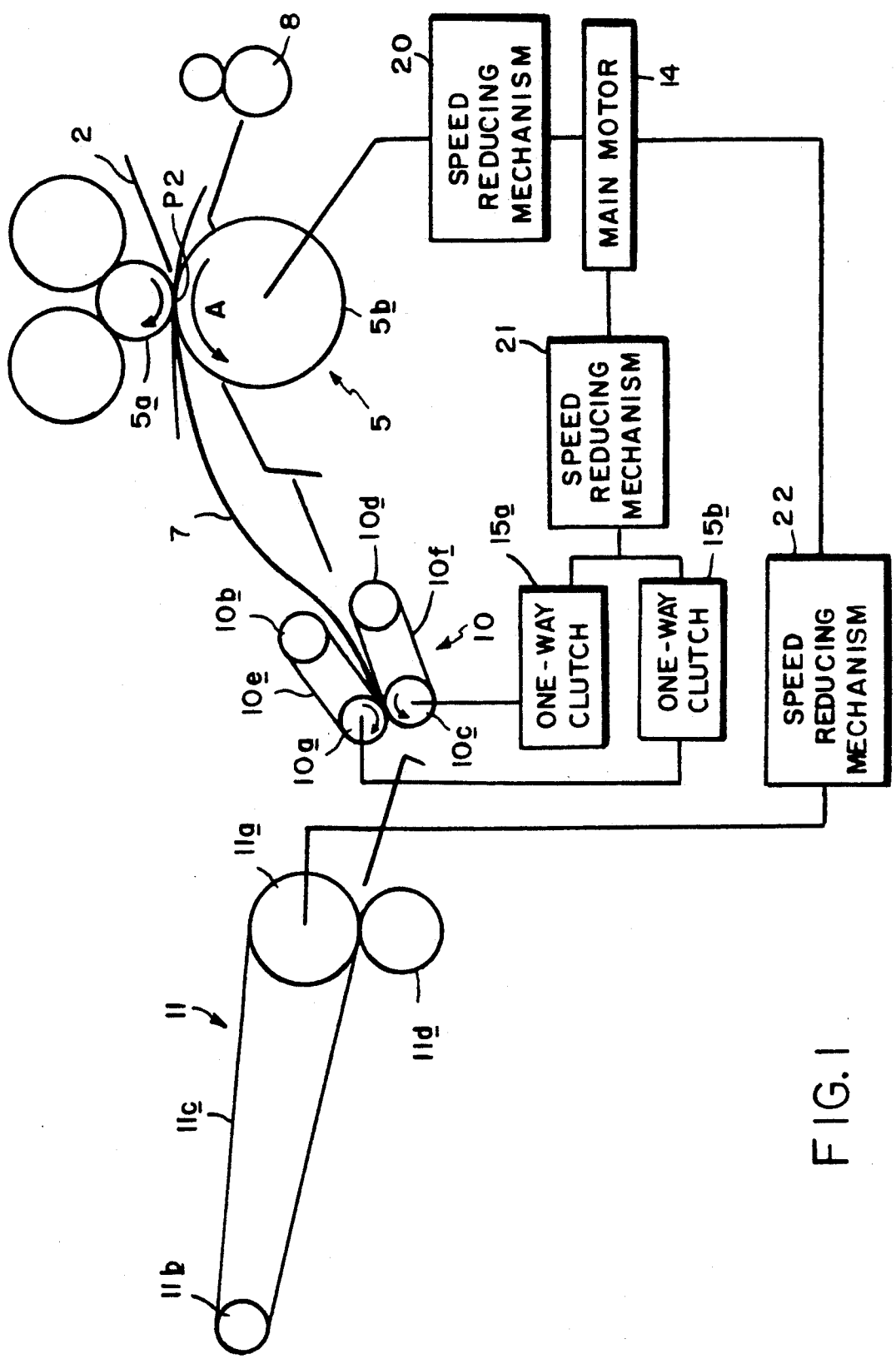
FIG. 1 is a conceptual view showing an image receiving sheet transport system according to the present invention.

As shown in FIG. 1, the paper transport device 10 has a pair of upper and lower transport belts 10e and 10f. The upper transport belt 10e is applied on a driving roller 10a disposed on the downstream side of the transporting direction of the image receiving sheet and an idle roller 10b disposed on the upstream side of the transporting direction of the image receiving sheet. Likewise, the lower transport belt 10f is applied on a driving roller 10c disposed on the downstream side of the transporting direction of the image receiving sheet and an idle roller 10d disposed on the upstream side of the transporting direction of the image receiving sheet. The pair of transport belts 10e and 10f are pressed against each other on the downstream side of the transporting direction of the image receiving sheet by means of the driving rollers 10a and 10c. Power from the main motor 14 of the copying machine is transmitted to both the driving rollers 10a and 10c via one-way clutches 15a and 15b with their speed reduced to a prescribed level by means of a speed reducing mechanism 21. The one-way clutches 15a and 15b are so designed as to transmit torque to the driving rollers 10a and 10c only in the direction in which the image receiving sheet 7 is transported to the glosser unit 11.

The image receiving sheet 7 is transported to the glosser unit 11 through the paper transport device 10. The glosser unit 11 has a heat resisting glosser belt 11c disposed above the transport path of the image receiving sheet 7. The glosser belt 11c is applied on a heat roller 11a containing a heater such as a halogen lamp and a tension roller 11b disposed downstream from the heat roller 11a. Disposed under the heat roller 11a is a pressure roller 11d which is pressed against the heat roller 11a with the glosser belt 11c interposed therebetween. The image receiving sheet 7 on which the image has been formed by the pressure developing device 5 is heated and pressed between the heat roller 11a and the pressure roller 11d of the glosser unit 11. The image on the image receiving sheet 7 is formed with the coloring dyes, and application of heat accelerates the coloring reaction of the dyes, thus giving clearness to the image. Also, the image receiving sheet 7 is pre-coated with thermoplastic resin which, when heated, softens and melts, and the surface of the image receiving sheet 7 is covered with the molten resin. Pressure is applied to the molten resin which is thereby smoothed to give a glossy finish to the image. The image receiving sheet 7 passed between the heat roller 11a and the pressure roller 11d is transported toward the downstream side along the glosser belt 11c. While being thus transported, the image receiving sheet 7 is gradually cooled, and after being cooled sufficiently, it is separated from the glosser belt 11c under the tension roller 11b. Occurrence of offset is prevented by sufficiently cooling the image receiving sheet 7 before separating it from the glosser belt 11c.

Power of the main motor 14 is transmitted to the heat roller 11a of the glosser unit 11 with their speed reduced by a suitable speed reducing mechanism 22.

The surface speed of the heat roller 11a of the glosser unit 11 is set to the same speed V1 as that of the lower pressure developing roller 5b of the pressure developing device 5. Therefore, the speed at which the image receiving sheet 7 is transported by the pressure developing device 5 is the same as the speed at which it is transported by the glosser unit 11. On the other hand, the surface speed of each of the driving rollers 10a and 10c of the transport device 10 is set at a slower speed V2 than the speed V1.

On the opposite side of the copying machine from where the paper cassettes 6a and 6b are mounted, there is disposed a paper exit tray 9 onto which the image receiving sheet 7 passed through the glosser unit 11 is discharged by means of a paper exit roller 12.

In the above image forming apparatus, both the leading edge of the latent image formed on the photosensitive sheet 2 and the leading edge of the image receiving sheet 7 are fed toward the position between the pressure developing rollers 5a and 5b of the pressure developing device 5 which are placed in a disengaged condition. When the leading edge of the latent image formed on the photosensitive sheet 2 and the leading edge of the image receiving sheet 7 are both positioned between the pressure developing rollers 5a and 5b, transportation of the two sheets 2 and 7 is temporarily stopped, and the pressure developing rollers 5a and 5b are placed in a pressing condition. When the leading edges of the two sheets 2 and 7, superimposed one on top of the other, are pressed together by the pressure developing rollers 5a and 5b, the lower pressure developing roller 5b is rotated in the direction shown by arrow A in FIG. 1 to transport the photosensitive sheet 2 and the image receiving sheet 7 while they are being pressed together between the pressure developing rollers 5a and 5b. At this time, the transport device 10 and the glosser unit 11 are also driven, both being ready to transport the image receiving sheet 7.

The leading edge of the image receiving sheet 7 which has passed through the pressure developing device 5 is fed between the transport belts 10e and 10f of the transport device 10. As previously mentioned, the driving rollers 10a and 10c of the transport device 10 are rotated at the surface speed V2 which is slower than the surface speed V1 of the lower pressure developing roller 5a of the pressure developing device 5. Therefore, the leading portion of the image receiving sheet 7 transported by the transport belts 10e and 10f moves at a slower speed than the trailing portion thereof transported by the pressure developing rollers 5a and 5b, thus causing the image receiving sheet 7 to buckle between the pressure developing device 5 and the transport device 10.

While the image receiving sheet 7 is thus transported by the transport device 10, the leading edge of the image receiving sheet 7 is fed between the glosser belt 11c and the pressure roller 11d of the glosser unit 11. Since the surface speed V1 of the heat roller 11a on which the glosser belt 11c is applied is faster than the surface speed V2 of the driving rollers 10a and 10c of the transport device 10, the leading portion of the image receiving sheet 7 transported by the glosser belt 11c moves at a faster speed than the trailing portion thereof transported by the transport device 10, which causes the trailing portion to be pulled by the leading portion. At this time, since the torque is transmitted via the one-way clutches in the transporting direction of the image receiving sheet 7, the driving rollers 10a and 10c of the transport device 10 transporting the trailing portion of the image receiving sheet 7 are allowed to overrun in the transporting direction of the image receiving sheet 7. Therefore, when the trailing portion of the image receiving sheet 7 between the transport belts 10e and 10f is pulled by the leading portion thereof, the driving rollers 10a and 10c are caused to overrun, thus making the transport belts 10e and 10f run at the same surface speed as that of the image receiving sheet 7. As a result, the image receiving sheet 7 is transported in integral fashion with the glosser belt 11c of the glosser unit 11, forcibly pulling out the image receiving sheet 7 from between the transport belts 10a and 10c. This prevents the image receiving sheet 7 from being damaged.

Thus, the image receiving sheet 7 is transported with its leading portion stretched between the transport device 10 and the glosser unit 11 by being pulled by the glosser unit 11, while the trailing portion thereof between the pressure developing device 5 and the transport device 10 is transported in a buckled state. The image receiving sheet 7 fed into the glosser unit 11 is heated and pressed, which accelerates the coloring of the image on the image receiving sheet 7 and gives a glossy finish thereto.

When the trailing edge of the image receiving sheet 7 has reached the pressure developing point P2, the rotation of the pressure developing rollers 5a and 5b stops, thereby stopping the transportation of the image receiving sheet on the pressure developing rollers 5a and 5b. At this time, the leading edge of the image receiving sheet 7 keeps being transported by the glosser unit 11, to feed the buckled portion of the image receiving sheet 7 between the pressure developing device 5 and the transport device 10 toward the glosser unit 11. In the meantime, the pressure developing rollers 5a and 5b are disengaged to release pressure on the trailing edge of the image receiving sheet 7. Then, the trailing edge of the image receiving sheet 7 is transported by the glosser unit 11, where it is treated with a glossy finish.

Thus, according to the present invention, when the leading edge of the image receiving sheet is transported by the transport device, the image receiving sheet is buckled between the pressure developing device and the transport device, and the buckled portion of the image receiving sheet is taken up when the pressure developing device releases pressure, thus preventing the possibility of the image receiving sheet stopping in the glosser unit when the pressure is released. This serves to provide a reliable prevention of offset in which the developer adheres to the glosser belt of the glosser unit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image receiving sheet transport system comprising:
   a pressure developing device for transporting a photosensitive sheet coated with light and pressure sensitive microcapsules containing photosetting materials and coloring dyes and an image receiving sheet coated with developer which reacts with the coloring dyes to develop colors, the pressure developing device transporting, in a transporting direction, the photosensitive sheet and the image receiving sheet, the two sheets being superimposed one on top of the other so that during transportation the two sheets are pressed together by said pressure developing device to form an image on the image receiving sheet, pressure being applied when the leading edge of the image receiving sheet arrives at the pressure developing device and being released when the trailing edge thereof passes therefrom,
   a glosser unit spaced from the pressure developing device in the transporting direction for heating and pressing the image receiving sheet passed through the pressure developing device, to give a glossy finish to the image formed on the image receiving sheet,
   a transport device, provided between the pressure developing device and the glosser unit, for grasping the image receiving sheet on both surfaces thereof and transporting, in the transporting direction, the image receiving sheet that has passed through the pressure developing device on to the glosser unit,
   a first speed reducing means for transmitting power to the pressure developing device so as to transport the two sheets at a first transporting speed,
   a second speed reducing means for transmitting power to the transport device so as to transport the image receiving sheet at a second transporting speed lower than the first transporting speed,
   a third speed reducing means for transmitting power to the glosser unit so as to transport the image receiving sheet at a third speed higher than the second speed, and
   a one-way clutch for transmitting power to the transport device from the second speed reducing device so that the image receiving sheet is transported only in the transporting direction,
   wherein the differences in transporting speeds between the pressure developing means and the glosser unit causes the image receiving sheet transported from the pressure developing device to the glosser unit to be buckled by the time the image receiving sheet reaches the glosser unit.

2. An image receiving sheet transport system according to claim 1, wherein the transport device has a pair of transport belts.

3. An image receiving sheet transport system according to claim 2, wherein each of the transport belts is applied on a pair of driving and idle rollers.

4. An image receiving sheet transport system according to claim 3, wherein power is transmitted to the driving roller via the one-way clutch.

5. An image receiving sheet transport system comprising:
   a pressure developing device for transporting a photosensitive sheet coated with light and pressure sensitive microcapsules containing photosetting materials and coloring dyes and an image receiving sheet coated with developer which reacts with the coloring dyes to develop colors, the pressure developing device transporting, in a transporting direction, the photosensitive sheet and the image receiving sheet, the two sheets being superimposed one on top of the other so that during transportation the two sheets are pressed together by said pressure developing device to form an image on the image receiving sheet, pressure being applied when the leading edge of the image receiving sheet arrives at the pressure developing device and being released when the trailing edge thereof passes therefrom,
   a glosser unit spaced from the pressure developing device in the transporting direction for heating and pressing the image receiving sheet passed through the pressure developing device, to give a glossy finish to the image formed on the image receiving sheet,
   a transport device, provided between the pressure developing device and the glosser unit, for grasping the image receiving sheet on both surfaces thereof and transporting the image receiving sheet on both surfaces the image receiving sheet, in the transporting direction, that has passed through the pressure developing device on to the glosser unit,
   a first speed reducing means for transmitting power to the pressure developing device so as to transport the two sheets at a first transporting speed,
   a second speed reducing means for transmitting power to the transport device so as to transport the image receiving sheet at a second transporting speed lower than the first transporting speed, a third speed reducing means for transmitting power to the glosser unit so as to transport the image receiving sheet at the first speed, and a one-way clutch for transmitting power to one of the transport device and the second speed reducing device so that the image receiving sheet is transported only in the transporting direction, wherein the differences in transporting speed between the pressure developing means and the glosser unit causes the image receiving sheet transported from the pressure developing device to the glosser unit to be buckled by the time the image receiving sheet reaches the glosser unit.

* * * * *